(12) United States Patent
Li et al.

(10) Patent No.: US 11,295,646 B2
(45) Date of Patent: Apr. 5, 2022

(54) SHIFT-REGISTER UNIT, A GATE-DRIVING CIRCUIT AND DRIVING METHOD, AND A DISPLAY APPARATUS

(71) Applicants: BOE TECHNOLOGY GROUP CO., LTD., Beijing (CN); Beijing BOE Display Technology Co., Ltd., Beijing (CN)

(72) Inventors: Feng Li, Beijing (CN); Yu Ma, Beijing (CN); Yan Yan, Beijing (CN); Qi Sang, Beijing (CN)

(73) Assignees: BOE TECHNOLOGY GROUP CO., LTD., Beijing (CN); Beijing BOE Display Technology Co., Ltd., Beijing (CN)

( * ) Notice: Subject to any disclaimer, the term of this patent is extended or adjusted under 35 U.S.C. 154(b) by 861 days.

(21) Appl. No.: 16/073,019

(22) PCT Filed: Nov. 21, 2017

(86) PCT No.: PCT/CN2017/112094
§ 371 (c)(1),
(2) Date: Jul. 26, 2018

(87) PCT Pub. No.: WO2019/033599
PCT Pub. Date: Feb. 21, 2019

(65) Prior Publication Data
US 2021/0174718 A1 Jun. 10, 2021

(30) Foreign Application Priority Data
Aug. 17, 2017 (CN) .................. 201710706407.X

(51) Int. Cl.
*G09G 3/20* (2006.01)
*G06F 3/041* (2006.01)
*G11C 19/28* (2006.01)

(52) U.S. Cl.
CPC ........... *G09G 3/20* (2013.01); *G06F 3/04166* (2019.05); *G11C 19/28* (2013.01);
(Continued)

(58) Field of Classification Search
CPC ............. G09G 3/20; G09G 2310/0267; G09G 2310/0286; G09G 2310/08; G06F 3/04166; G11C 19/28
See application file for complete search history.

(56) References Cited

U.S. PATENT DOCUMENTS

| 9,123,393 | B2 * | 9/2015 | Zhang | .................. G11C 7/00 |
| 2010/0054392 | A1 * | 3/2010 | Chen | .................. G11C 19/28 |
| | | | | 377/79 |

(Continued)

FOREIGN PATENT DOCUMENTS

| CN | 103489391 A | 1/2014 |
| CN | 103943055 A | 7/2014 |

(Continued)

OTHER PUBLICATIONS

First Office Action in the Chinese Patent Application No. 201710706407.X, dated Mar. 16, 2020; English translation attached.

(Continued)

*Primary Examiner* — Sejoon Ahn
(74) *Attorney, Agent, or Firm* — Intellectual Valley Law, P.C.

(57) ABSTRACT

The present application discloses a shift-register circuit used as a shift-register unit of current stage including a control sub-circuit coupled to a shift-register unit of previous stage and configured to recharge a pull-up node of the shift-register unit of previous stage during a touch-control operation performed after a gate line scanning of previous stage ends and before the gate line scanning of current stage starts. The control sub-circuit is further configured to compensate (Continued)

an internal voltage of the shift-register unit of previous stage before the touch-control operation ends so that the shift-register unit of previous stage is triggered to perform the gate line scanning of previous stage followed by the shift-register unit of current stage to perform the gate line scanning of current stage.

16 Claims, 5 Drawing Sheets

(52) U.S. Cl.
CPC .............. *G09G 2310/0267* (2013.01); *G09G 2310/0286* (2013.01); *G09G 2310/08* (2013.01)

(56) References Cited

U.S. PATENT DOCUMENTS

| | | | | |
|---|---|---|---|---|
| 2010/0177081 A1* | 7/2010 | Lee | ................... | G09G 3/3648 345/211 |
| 2015/0091822 A1* | 4/2015 | Dong | ................... | G06F 3/0416 345/173 |
| 2016/0049126 A1 | 2/2016 | Zhang et al. | | |
| 2016/0274713 A1 | 9/2016 | Zhang et al. | | |
| 2017/0115808 A1 | 4/2017 | Cho et al. | | |
| 2017/0185194 A1 | 6/2017 | Kim et al. | | |
| 2017/0199617 A1 | 7/2017 | Gu et al. | | |
| 2018/0190197 A1* | 7/2018 | Chang | ................... | G09G 3/3233 |
| 2018/0196563 A1 | 7/2018 | Iwase et al. | | |

FOREIGN PATENT DOCUMENTS

| | | |
|---|---|---|
| CN | 104036738 A | 9/2014 |
| WO | 2017006815 A1 | 1/2017 |

OTHER PUBLICATIONS

The Extended European Search Report in the European Patent Application No. 17895502.7, dated Mar. 24, 2021.

\* cited by examiner

SHIFT-REGISTER UNIT, A GATE-DRIVING CIRCUIT AND DRIVING METHOD, AND A DISPLAY APPARATUS

CROSS-REFERENCE TO RELATED APPLICATION

This application is a national stage application under 35 U.S.C. § 371 of International Application No. PCT/CN2017/112094, filed Nov. 21, 2017, which claims priority to Chinese Patent Application No. 201710706407.X, filed Aug. 17, 2017, the contents of which are incorporated by reference in the entirety.

TECHNICAL FIELD

The present invention relates to display technology, more particularly, to a shift-register unit, a gate-driving circuit and driving method thereof, and a display apparatus having the same.

BACKGROUND

Gate-on-array (GOA) type gate-driving circuit adopted in many display apparatus including thin-film transistor liquid-crystal display (TFT-LCD) and active-matrix organic light-emitting diode (AMOLED) display typically is comprised of multiple shift-register units cascaded as a multi-stage circuit. GOA gate-driving circuit is advantageous in many aspects such as less space taken from the display area, low costs, and high density integration. When the display apparatus is integrated with touch-control function to form so-called Touch Display Driver Integrated (TDDI) product, the GOA gate-driving circuit needs to stop outputting the gate-driving signal during a touch-control operation performed in the display area and only to restart outputting the gate-driving signal again after the touch-control operation ends. In this way, the touch-control operation and the display scanning operation are performed alternately in time.

SUMMARY

In an aspect, the present disclosure provides a shift-register circuit configured as a shift-register unit of current stage cascaded with a shift-register unit of previous stage and a shift-register unit of next stage. The shift-register circuit includes a main sub-circuit configured to generate an output signal for driving a gate line scanning of current stage and to charge a pull-up node of next stage to a high-voltage level. The shift-register circuit further includes a control sub-circuit coupled to the main sub-circuit and the shift-register unit of previous stage. The control sub-circuit is configured to recharge the pull-up node of previous stage during a touch-control operation performed after a gate line scanning of previous stage ends and before the gate line scanning of current stage starts. The control sub-circuit is configured to compensate an internal voltage of the shift-register unit of previous stage before the touch-control operation ends so that the shift-register unit of previous stage is triggered to perform the gate line scanning of previous stage followed by the shift-register unit of current stage to perform the gate line scanning of current stage.

Optionally, the main sub-circuit includes a pull-up node. The control sub-circuit includes a switch transistor and a control line configured to be provided with a control signal. The switch transistor has a gate coupled to the pull-up node, a first terminal coupled to the control line, and a second terminal coupled to an input port of the shift-register unit of previous stage.

Optionally, the switch transistor is an NPN-type transistor.

Optionally, the switch transistor is a PNP-type transistor.

Optionally, the main sub-circuit includes an output port coupled to a reset port of the shift-register unit of previous stage and an input port coupled to an output port of the shift-register unit of previous stage.

In another aspect, the present disclosure provides a gate-driving circuit including a shift-register circuit described herein. The shift-register circuit is provided as one of multiple shift-register units cascaded electrically in multiple stages.

Optionally, the multiple shift-register units include a single series of shift-register units cascaded from a 1st-stage to an N-th stage with each even-numbered stage adjacently coupled to a odd-numbered stage. The shift-register unit of odd-numbered stage includes a timing-control port coupled to a first clock signal line and a control sub-circuit including a switch transistor having a first terminal coupled to a first control line. The shift-register unit of even-numbered stage includes a timing-control port coupled to a second clock signal line and a control sub-circuit including a switch transistor having a first terminal coupled to a second control line. For any two adjacently cascaded stages in the single series, an output port of a shift-register unit of current stage is coupled to a reset port of a shift-register unit of previous stage and an input port of the shift-register unit of current stage is coupled to an output port of the shift-register unit of previous stage.

Optionally, the the multiple shift-register units include a first series of shift-register units of all odd-numbered stages cascaded electrically one after another and a second series of shift-register units of all even-numbered, stages cascaded electrically one after another. Each shift-register unit of (2n−1)-th stage in the first series includes a timing-control port coupled to a first clock signal line and a control sub-circuit including a switch transistor having a first terminal coupled to a first control line, Each shift-register unit of (2n)-th stage in the second series adjacent to the each shift register unit of (2n−1)-th stage in the first series includes a timing-control port coupled to a second clock signal line and a control sub-circuit including a switch transistor having a first terminal coupled to a second control line. Each shift-register units of (2n+1)-th stage in the first series adjacent to the each shift-register units of (2n)-th stage in the second series includes a timing-control port coupled to a thud clock signal line and a control sub-circuit including a switch transistor having a first terminal coupled to third control line. Each shift-register unit of (2n+2)-th stage in the second series adjacent to the each shift-register unit of (2n+1)-th stage in the first series includes a timing-control port coupled to a fourth clock signal line and a control sub-circuit including a switch transistor having a first terminal coupled to fourth control line. Here a is an integer equal to or greater than 1.

In yet another aspect, the present disclosure provides a display apparatus including a gate-driving circuit described herein.

In still another aspect, the present disclosure provides a method of driving the shift-register circuit described herein. The method includes performing a gate line scanning of previous stage before entering a touch period; performing a touch-control operation during the touch period; performing an internal voltage compensation to the shift-register unit of previous stage before the touch period ends; repeating the gate line scanning of previous stage based on the internal voltage compensation after the touch period ends; and performing a gate line scanning of current stage.

Optionally, the method of performing a gate line scanning of previous stage includes providing a first clock signal at a turn-on level to the main sub-circuit in the shift-register unit of previous stage in a first charging period and a second clock signal at a turn-off level to the main sub-circuit in the shift-register unit of current stage in a repeat-driving period, thereby outputting a gate-driving signal at the turn-on level to a gate line of previous stage.

Optionally, the method of performing a gate line scanning further includes using the gate-driving signal outputted from the shift-register unit of previous stage to charge a pull-up node in the shift-register unit of current stage up to the turn-on level in the first charging period.

Optionally, the method of performing the touch-control operation includes providing no clock signal to the shift-register unit of previous stage and the shift-register unit of current stage to substantially maintain the turn-on level at the pull-up node in the shift-register unit of current stage and a pull-up node in the shift-register unit of previous stage in the touch period after the first charging period.

Optionally, the method of performing an internal voltage compensation includes providing a control voltage to the control signal line of the control sub-circuit in the shift-register unit of current stage in a second charging period before the touch period ends to charge the pull-up node of the shift-register unit of previous stage back to the turn-on level.

Optionally, the method of repeating the gate line scanning of previous stage includes providing the first clock signal at a turn-on level to the shift-register unit of previous stage in a repeat-driving period after the touch period ends and the second clock signal at a turn-off level to the shift-register unit of current stage in the repeat-driving period, thereby outputting a gate-driving signal at the turn-on level to the gate line of previous stage and perform an internal voltage compensation to the shift-register unit of current stage.

Optionally, the method of performing a gate line scanning of current stage includes providing the second clock signal at the turn-on level to the main sub-circuit in the shift-register unit of current stage and the first clock signal at a turn-off level to the shift-register unit of previous stage, thereby outputting a gate-driving signal at the turn-on level to a gate line of current stage in a continue-scanning period after the repeat-driving period.

In still yet another aspect, the present disclosure provides a method of driving a gate-driving circuit described herein. The gate-driving circuit includes multiple shift-register units cascaded electrically in multiple stages. The method includes performing a touch-control operation after performing a gate line scanning of previous stage adjacently cascaded to current stage.

Optionally, for the multiple shift-register units including a single series of shift-register units cascaded from a 1st-stage to an N-th stage, the method of performing a gate line scanning includes providing a first clock signal to the timing-control port of the shift-register unit of odd-numbered stage and a second clock signal to the timing-control port of the shift-register unit of even-numbered stage. The method of performing the touch-control operation includes suspending the first clock signal and the second clock signal in a touch period. The method of performing the touch-control operation further includes providing a first control signal to the control sub-circuit of the shift-register unit of odd-numbered stage and a second control signal to the control sub-circuit of the shift-register unit of even-numbered stage at an end of the touch period.

Optionally, for the multiple shift-register units including a first series of shift-register units of all odd-numbered stages cascaded electrically one after another and a second series of shift-register units of all even-numbered stages cascaded electrically one after another, the method of performing a gate line scanning includes providing a first clock signal to the timing-control port of the shift-register unit of (2n−1)-th stage in the first series, a second clock signal to the timing-control port of the shift-register unit of (2n)-th stage in the second series, a third clock signal to the timing-control port of the shift-register unit of (2n+1)-th stage in the first series, and a fourth clock signal to the timing-control port of the shift-register unit of (2n+2)-th stage in the second series. The third clock signal, the fourth clock signal, the first clock signal, and the second clock sisal are characterized by a pulse period and loaded with a same turn-on level sequentially in time with a relatively delayed by ¼ of the pulse period. The method of performing the touch-control operation includes suspending the first clock signal, the second clock signal, the third clock signal, and the fourth clock signal in a touch period, and providing a first control signal to the control sub-circuit of the shift-register unit of (2n−1)-th stage in the first series, a second control signal to the control sub-circuit of the shift-register unit of (2n)-th stage in the second series, a third control signal to the control sub-circuit of the shift-register unit of (2n+1)-th stage in the first series, and a fourth control signal to the control sub-circuit of the shift-register unit of (2n+2)-th stage in the second series at an end of the touch period. The third control signal and the fourth control signal are characterized by the pulse period and loaded with a same turn-on level sequentially in time with a delay of ¼ of the pulse period, the first control signal and the second control signal are characterized by a same turn-off level. Here n is an integer no smaller than 1.

Optionally, before stopping the touch period after performing the gate line scanning of the (2n)-th stage, the method further includes providing a third control signal to the control sub-circuit of the shift-register unit of (2n+1)-th stage in the first series and subsequently or at the same time providing a fourth control signal to the control sub-circuit of the shift-register unit of (2n+2)-th stage in the second series.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In the display apparatus integrated with touch-control function, the GOA gate-driving circuit needs to stop outputting the gate-driving signal during a touch-control operation performed in the display area and only to restart outputting the gate-driving signal again after the touch-control operation ends. Thus, the touch-control operation and the display scanning operation are performed alternately in time.

Assuming that the GOA gate-driving circuit is configured as a series of cascaded shift-register units with two clock signal lines (CLK), a touch-control operation is enabled after driving the shift-register unit to output a gate-driving signal to the (N−1)-th gate line. At this time, the pull-up node in the shift-register unit for driving N-th gate line is turned to be a high voltage level and stay at the high voltage level until the touch-control operation ends and the clock signal CLK supplied to the shift-register unit to drive it to output a gate-driving signal to the N-th gate line. Because that the touch-control operation lasts a relative long time, e.g., 100 ms, the voltage level at the pull-up node may decrease due to leakage current of the switch transistor in the shift-register unit. The decreased voltage level at the pull-up node will affect the output of the gate-driving signal to the N-th gate line which in turn affects the displayed image.

Accordingly, the present disclosure provides, inter alia, a shift-register unit, a gate-driving circuit and driving method thereof, and a display apparatus having the same that substantially obviate one or more of the problems due to limitations and disadvantages of the related art.

Figure 1:
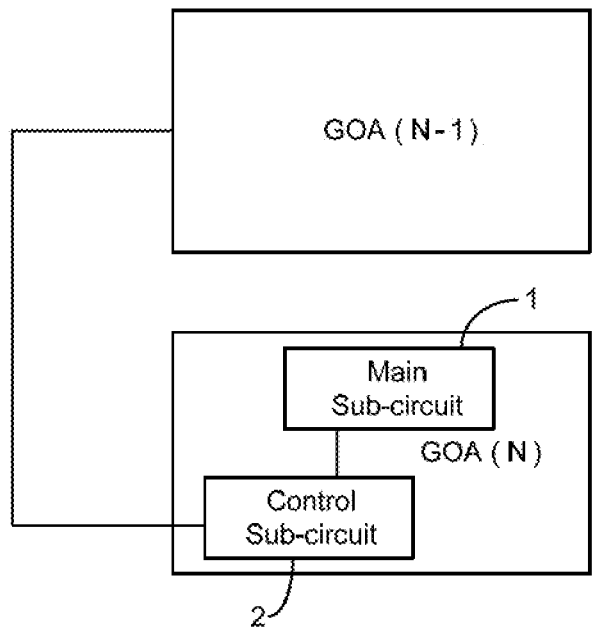
FIG. 1 is a simplified block diagram of a shift-register circuit according to an embodiment of the present disclosure.
Figure 2:
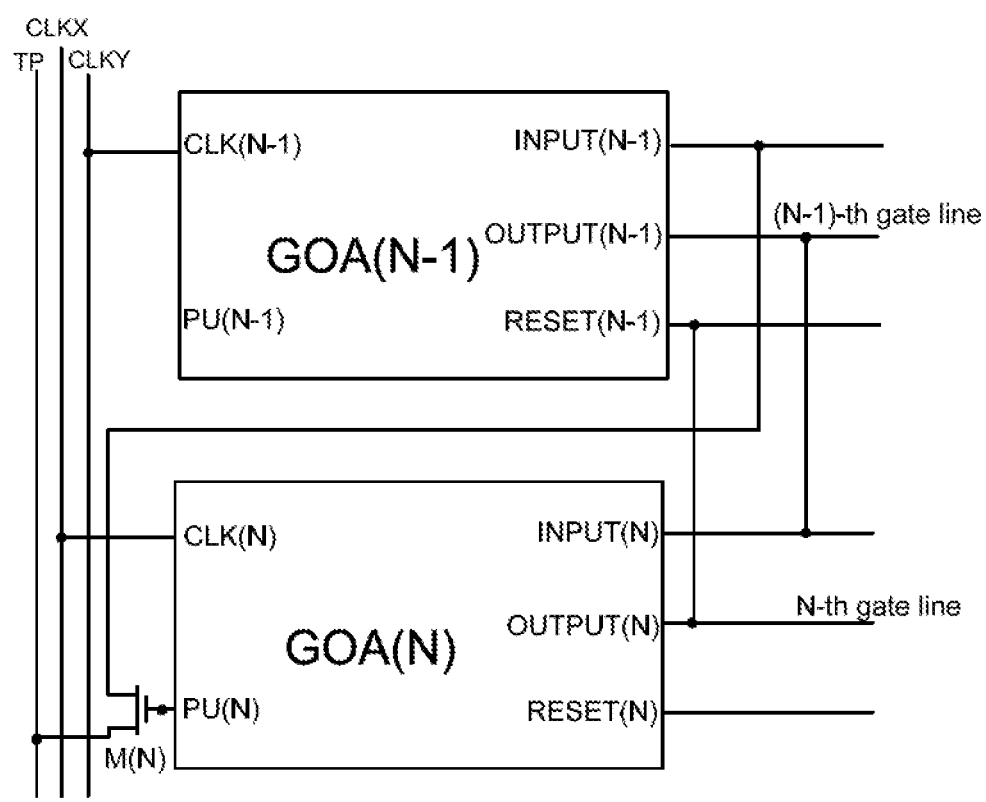
FIG. 2 is a diagram of a shift-register circuit according to a specific embodiment of the present disclosure.

In one aspect, the present disclosure provides a shift-register circuit configured to be a shift-register unit to be cascaded in a multi-stage series to form a Gate-on-array (GOA) gate-driving circuit. FIG. 1 shows a shift-register unit of current stage cascaded to an adjacent shift-register unit of previous stage according to some embodiments of the present disclosure. FIG. 2 shows a specific example of the shift-register unit of current stage cascaded with the shift-register unit of previous stage respectively supplied with 2 clock signals. Referring to FIG. 1, the shift-register unit of current stage [denoted as GOA(N)] which is cascaded with the shift-register unit of previous stage [denoted as GOA(N−1)]. The shift-register unit of current stage GOA(N) includes a main sub-circuit 1 and a control sub-circuit 2. The main sub-circuit 1 is configured to drive the shift-register unit of current stage GOA(N) to perform a gate line scanning of current stage by outputting a gate-driving signal to a N-th gate line (see FIG. 2). The control sub-circuit 2 is coupled to the main sub-circuit 1 and is connected to the shift-register unit of previous stage GOA(N−1).

When the GOA(N−1) finishes a gate line scanning of (N−1)-th stage while before the GOA(N) starts a gate line scanning of N-th stage, a touch-control operation can be performed. The control sub-circuit 2 is configured to provide an internal voltage compensation to the shift-register unit of previous stage GOA(N−1) before the touch-control operation ends. The internal voltage compensation to the GOA (N−1) allows the shift-register unit of previous stage GOA (N−1) to repeat the gate line scanning of (N−1)-th stage by outputting the gate-driving signal to the (N−1)-th gate line again after the touch-control operation ends, so that the shift-register unit of current stage GOA(N) can continue to perform the gate line scanning of N-th stage by outputting a gate-driving signal to the N-th gate line. Thus, even though the duration of touch-control operation after the gate line scanning of (N−1)-th stage is relative long (in an order of magnitude of $10^{-4}$ s), the repeat of gate line scanning of the (N−1)-th stage is able to prevent the gate-driving signal outputted from the shift-register unit of current stage GOA (N) to the N-th gate line being affected due to internal node voltage drop, ensuring good quality of the image displayed by a display apparatus used the shift-register unit described herein.

In an embodiment, the main sub-circuit 1 can be configured to be any conventional shift-register circuit that is able to allow the shift-register unit of current stage to perform a gate line scanning of current stage.

Referring to FIG. 2, the main sub-circuit 1 includes a pull-up node PU(N). The control sub-circuit 2 includes a switch transistor M(N) and a control signal line TP. The switch transistor M(N) has a gate coupled to the pull-up node PU(N), a first terminal coupled to the control signal line TP, and a second terminal coupled to an input port INPUT(N−1) of the shift-register unit of previous stage GOA(N−1).

Referring to FIG. 2 again, the main sub-circuit 1 includes an output port OUTPUT(N) coupled to a reset port RESET (N−1) of GOA(N−1) and an input port INPUT(N) coupled to the output port OUTPUT(N−1) of GOA(N−1). GOA(N) also includes a timing-control port CLK(N) coupled to X-th clock signal line CLKX. GOA(N−1) includes a timing-control port CLK(N−1) coupled to Y-th clock signal line CLKY. The shift-register unit of (N−1)-th stage GOA(N−1) is cascaded with the shift-register unit of N-th stage GOA (N). GOA(N−1) and GOA(N) are controlled by clock signals from the X-th clock signal line CLKX and the Y-th clock signal line CLKY to perform gate line scanning of (N−1)-th stage and the gate line scanning of N-th stage.

In the embodiment, the switch transistor M(N) and other switch transistors (not explicitly shown) in the main sub-circuit 1 are NPN-type transistor. Each control signal such as clock signal, input signal, is provided with a high voltage signal as a turn-on voltage for the NPN-type transistor. The gate-driving signal outputted from the GOA of a certain stage to the gate line of corresponding stage is also a high voltage signal. Optionally, the switch transistor M(N) and other switch transistors in the main sub-circuit 1 are PNP-type transistor. Then the corresponding control signal is provided with a low voltage signal as a turn-on voltage for the PNP-type transistor. Accordingly, the gate-driving signal outputted from the GOA to the gate line of the corresponding stage is a low voltage signal. Optionally, some transistors in each GOA stage can be NPN-type transistor and some other transistors in the each GOA stage can be PNP-type transistor while the corresponding control signal can be set to proper high or low voltage signals for achieving substantially the same function for outputting a gate-driving signal to the corresponding gate line.

As the GOA(N) is cascaded with the GOA(N−1) in a configuration shown in FIG. 2, an internal voltage compensation to the GOA(N−1) can be done before a touch-control operation ends. The internal voltage compensation to the GOA(N−1) allows the GOA(N−1) to repeat the gate line scanning of (N−1)-th stage after the touch-control operation ends so that the GOA(N) can continue to perform the gate line scanning of N-th stage. This allows the pull-up node PU(N) of the GOA(N) to maintain its voltage level stable after the gate line scanning of (N−1)th stage ends to avoid the gate-driving signal outputted to the N-th gate line from being affected by the leakage current in the GOA(N). Stable gate-driving signal shall ensure the quality of displayed image by the display apparatus of using the shift-register unit.

In another aspect, the present disclosure provides a method of driving the shift-register circuit described herein. The method includes performing a gate line scanning of previous stage before a touch period for performing a touch-control operation. Optionally, the touch-control operation is performed on the same display apparatus containing the shift-register circuit. Optionally, performing the gate line scanning of previous stage includes operating a main sub-circuit in the shift-register unit of previous stage to generate an output of a gate-driving signal to a gate line of previous stage. Optionally, the gate-driving signal is at least at a turn-on voltage level. The method further includes performing the touch-control operation during the touch period. Additionally, the method includes performing an internal voltage compensation to the shift-register unit of previous stage before the touch period ends. The method further includes repeating the gate line scanning of previous stage after the touch period ends based on the internal voltage compensation. Optionally, repeating the gate line scanning of previous stage includes operating the main sub-circuit in the shift-register unit of previous stage to output a gate-driving signal at the turn-on voltage level to a gate line of previous stage, Moreover, the method includes performing a gate line scanning of current stage. Optionally, performing a gate line scanning of current stage includes operating the main sub-circuit in the shift-register unit of current stage to output a gate-driving signal at the turn-on voltage level to a gate line of current stage. Optionally, the gate line scanning of current stage is performed by the shift-register unit of current stage after the gate line scanning of previous stage repeated by the shift-register unit of previous stage.

Figure 3:
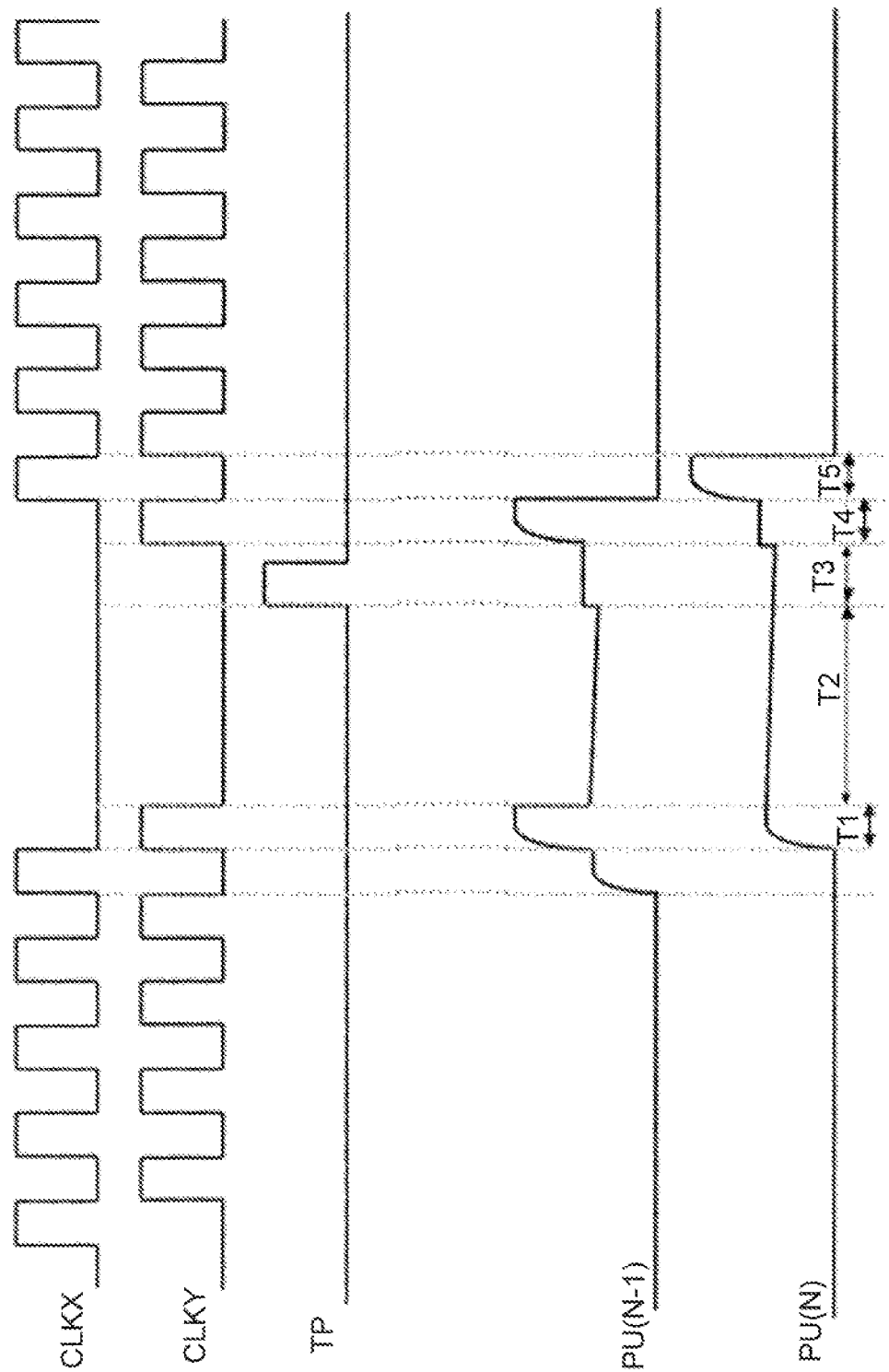
FIG. 3 is a timing waveform of driving the shift-register circuit of FIG. 2 according to an embodiment of the present disclosure.

FIG. 3 is a timing waveform of driving the shift-register circuit of FIG. 2 according to an embodiment of the present disclosure. The shift-register circuit is provided as one of multiple shift-register units cascaded electrically in multiple stages. Referring to FIG. 3, the method of driving the shift-register circuit is illustrated by providing two clock signals from dock signal lines CLKX and CLKY and a control signal from the control signal line TP in a single operation cycle to control the voltage levels at two pull-up nodes PU(N-1) and PU(N) of two adjacently cascaded shift-register units GOA(N-1) and GOA(N). In an embodiment, the single operation cycle includes a first charging period T1, a voltage-maintaining period T2, a second charging period T3, a repeat-driving period T4, and a continue-driving period T5. In the example, the touch period starts after the first charging period and substantially simultaneously with the voltage-maintaining period, and ends slightly after or at the same time when the second charging period ends.

Referring to circuit structure shown in FIG. 2 in association with the timing waveform of FIG. 3, in the first charging period T1, the shift-register unit of previous stage performs a gate line scanning to charge a pull-up node PU(N) of the shift-register unit of current stage so as to pull up its voltage level. In this period, the X-th clock signal line CLKX inputs a low voltage signal, e.g., a turn-off voltage corresponding to N-type (or NPN-type) transistor and the Y-th clock signal line CLKY inputs a high voltage signal, e.g., a turn-on voltage. The main sub-circuit in the shift-register unit of previous stage is configured to generate an output of a gate-driving signal to perform a gate line scanning to the gate line of previous stage. The pull-up node PU(N-1) of the shift-register unit of previous stage is also at high voltage level, e.g., a turn-on voltage.

In the voltage-maintaining period T2, it enters the touch period during which a touch-control operation is performed. Both the pull-up node PU(N-1) of the shift-register unit of previous stage and the pull-up node PU(N) of the shift-register unit of current stage are substantially maintained at high-voltage level. in this period, the X-th clock signal line CLKX inputs a low voltage signal and the Y-th clock signal line CLKY inputs a high voltage signal. As the touch period proceeds, the voltage level of the pull-up node PU(N-1) slightly decreases from the high voltage level and the voltage level of the pull-up node PU(N) also decreases to be lower than the turn-on voltage due to the effect of leakage current in internal switch transistor of the shift-register unit of current stage.

In the second charging period T3, before the touch period ends, the switch transistor M(N) of the control sub-circuit of the shift-register unit of current stage is turned on to allow a control signal inputted from the control signal line TP to control an additional charging to the pull-up node PU(N-1) of the shift-register unit of previous stage to pull up its voltage level back to the turn-on voltage obtained in the first charging period.

In T3, the X-th clock signal line CLKX inputs a low voltage signal and the Y-th dock signal line CLKY inputs a low voltage signal, the control signal line TP provides a high voltage signal (or a turn-on voltage). Because the pull-up node PU(N) is at the high voltage level, it turns on the switch transistor M(N) of the control sub-circuit to pass a high voltage from the control signal line TP to the shift-register unit of previous stage. This high voltage is used to charge the pull-up node PU(N-1) of the shift-register unit of previous stage to raise its voltage level again. Optionally, the second charging period T3 ends slightly ahead of the end of touch period so that the shift-register unit of previous stage is ready for driving another gate line scanning after the touch period.

In the repeat-driving period T4, the X-th clock signal line CLKX inputs a low voltage signal and the Y-th clock signal line CLKY inputs again a high voltage signal to the shift-register unit of previous stage to allow the latter to repeat a gate line scanning by outputting a gate-driving signal at the turn-on voltage to the gate line of previous stage. At the same time, the output of the gate-driving signal is passed to the input port of the shift-register unit of current stage to provide additional charging to the pull-up node PU(N) of the shift-register unit of current stage. The voltage level of the pull-up node PU(N) is raised slightly to the original turn-on voltage level to make the shift register unit of current stage ready to perform a gate line scanning. This avoids the voltage level drop at the pull-up node PU(N) due to leakage current thereof, thereby ensuring that images displayed by the display apparatus have good quality after the display apparatus performs a touch-control operation.

Optionally, the control signal inputted from the control signal line TP needs to be supplied substantially near the end of the touch period. This is advantageous in ensuring that the shift-register unit of previous stage to repeat a gate line scanning before the touch period ends and that the pull-up node PU(N) of the shift-register unit of current stage can be properly compensated to, be pulled up to the turn-on voltage level. lithe control signal (which is a pulse voltage) from TP is supplied too early, the voltage level of the pull-up node PU(N−1) of the shift-register unit of previous stage may still decrease due to leakage current of internal switch transistor thereof.

In the continue-scanning period T5, after the gate line scanning performed by tithe shift-register unit of previous stage, a clock signal is inputted to the shift-register unit of current stage so that it can continue the gate line scanning. In this period, the X-th clock signal line CLKX inputs a high voltage signal and the Y-th clock signal line inputs a low voltage signal. The high voltage signal from CLKX drives the shift-register unit of current stage to output a gate-driving signal at the turn-on voltage to the gate line of current stage. In other words, after the gate line scanning performed by the shift-register unit of previous stage, the shift-register unit of current stage continues to perform the gate line scanning of current stage.

Figure 4:
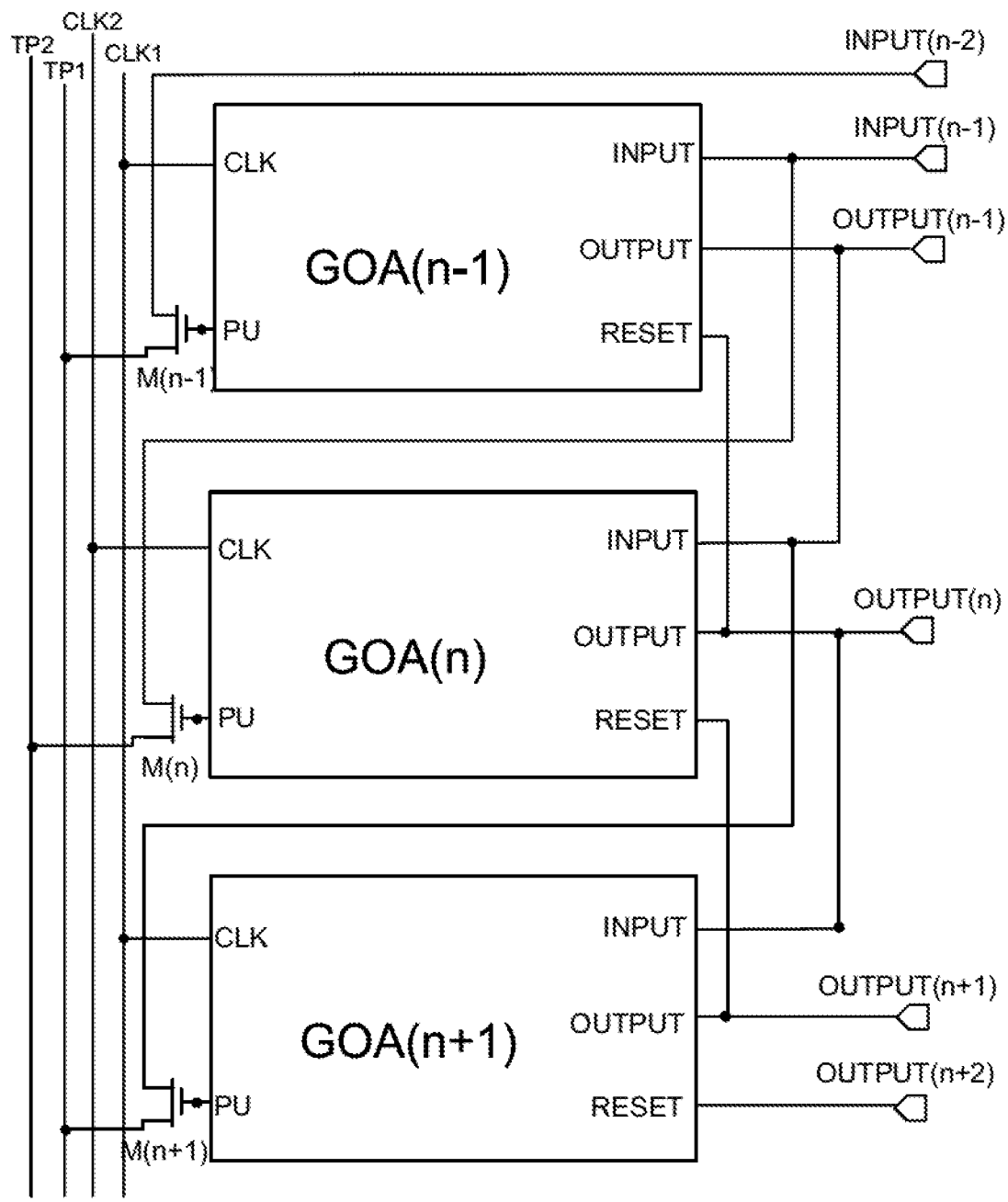
FIG. 4 is a schematic diagram of a gate-driving circuit according to an embodiment of the present disclosure.

In another aspect of the present disclosure, FIG. 4 shows an example of a gate-driving circuit including multiple shift-register units cascaded electrically in multiple stages numbered from 1 to N. Each shift-register unit is the shift-register circuit described herein shown in FIG. 1 and FIG. 2, In the example, the timing control port CLK of each of shift-register units of odd-numbered stage are coupled to a first clock signal line CLK1 and the timing control port of each of shift-register units of even-numbered stage are coupled to a second clock signal line CLK2. A first terminal of the switch transistor M in each of shift-register units of odd-numbered stage is coupled to the first control signal line TP1 and a first terminal of the switch transistor M in each of shift-register units of even-numbered stage is coupled to the second control signal line TP2. For any two adjacently cascaded shift-register units, e.g., GOA(n−1) and GOA(n), an output port of GOA(n) is connected to a reset port of GOA(n−1) and an input port of GOA(n) is connected to the output port of GOA(n−1).

In the embodiment, the shift-register units of odd-numbered stage is controlled by a first clock signal inputted from the first clock signal line CLK1 to perform gate line scanning of odd-numbered stage. The shift-register units of even-numbered stage is controlled by a second clock signal inputted from the second clock signal line CLK2 to perform gate line scanning of even-numbered stage. Each shift-register unit of either odd-numbered stage or even-numbered stage cascaded in the gate-driving circuit contains a control sub-circuit as shown in FIG. 1 and FIG. 2. A touch-control operation can be inserted between any two operations of gate line scanning performed by two adjacently cascaded shift-register units, during which the control sub-circuit thereof can be operated to ensure that the pull-up node voltage level of shift-register unit of current stage does not drop after the gate line scanning performed by the shift-register unit of previous stage. Thus, it prevents the drop of gate-driving signals outputted by the shift-register of current stage and all subsequent stages to affect all gate line scanning of all stages of entire display apparatus to ensure good image quality.

In the embodiment, multiple shift-register units of the gate-driving circuit are cascaded in multiple stages. A method of driving the gate-driving circuit is provided in the disclosure. During the operation of driving the gate-driving circuit, the method includes providing a first clock signal to the shift-register units of odd-numbered stage and a second clock signal to the shift-register units of even-numbered stage. A touch-control operation is inserted into any two adjacent operations of gate line scanning performed by two adjacently coupled shift-register units. The method further includes applying a first control signal to the control sub-circuit of the shift-register units of odd-numbered stage and a second control signal to the shift-register units of even-numbered stage before the touch-control operation ends.

In particular, referring to FIG. 4, the first clock signal line CLK1 provides the first clock signal to the shift-register units of odd-numbered stage and the second clock signal line CLK2 provides the second clock signal to the shift-register units of even-numbered stage. Driven respectively by the first clock signal and the second clock signal, the gate line scanning of odd-numbered stage and the gate line scanning of even-numbered stage are performed sequentially.

In the embodiment, before the touch-control operation ends, the first control signal is provided via the first control signal line TP1 to the control sub-circuits of the shift-register units of odd-numbered stage and the second control signal is provided via the second control signal line TP2 to the control sub-circuits of the shift-register units of even-numbered stage. In the embodiment, if the touch-control operation is inserted in a shift-register unit of an odd-numbered stage GOA(n−1) and an adjacently coupled next shift-register unit of an even-numbered stage GOA(n), the second control signal is able to provide an internal voltage compensation to the shift-register unit of the even-numbered stage GOA(n−1) before the touch-control operation ends. This enables that the GOA(n−1) can repeat the gate line scanning after the touch-control operation ends so as to make the shift-register unit of next odd-numbered stage GOA(n) to be ready for a corresponding next gate line scanning. In the embodiment, if the touch-control operation is inserted in a shift-register unit of an odd-numbered stage GOA(n−1) and an adjacently coupled next shift-register unit of an even-numbered stage GOA(n), the first control signal is able to provide an internal voltage compensation to the shift-register unit of the odd-numbered stage GOA(n−1) before the touch-control operation ends. This enables that the GOA(n−1) can repeat the gate line scanning after the touch-control operation ends so as to make the shift-register unit of next even-numbered stage GOA(n) to be ready for a corresponding next gate line scanning.

Figure 5:
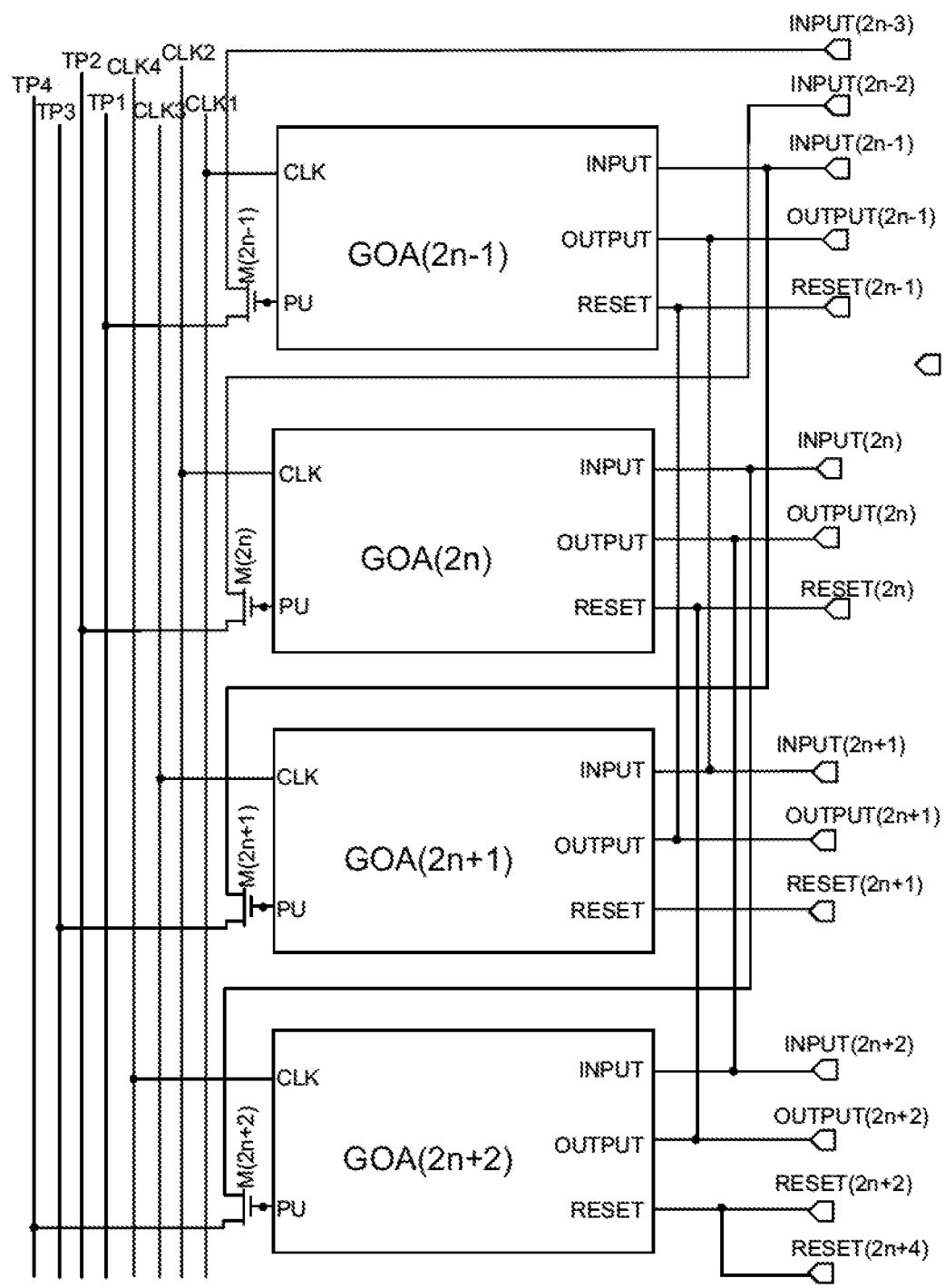
FIG. 5 is a schematic diagram of a gate-driving circuit according to another embodiment of the present disclosure.

In yet another aspect of the present disclosure, FIG. 5 shows an example of a gate-driving circuit including multiple shift-register units with a first series of shift-register units of all odd-numbered stages cascaded electrically one after another and a second series of shift-register units of all even-numbered stages cascaded electrically one after another. In particular, a shift-register unit of (2n−1)-th stain is cascaded with a shift-register unit of (2n+1)-th stage in the first series and a shift-register unit of (2n)-th stage is cascaded with a shift-register unit of (2n+2)-th stage in the second series. The gate-driving circuit in above cascaded structure is configured to provide gate-driving signals sequentially to a gate line of (2n−1)-th stage, a gate line of (2n)-th stage, a gate line of (2n+1)-th stage, and a gate line of (2n+2)-th stage, and so on. Each shift-register unit is the shift-register circuit described herein shown in FIG. 1 and FIG. 2. Here, n is an integer no smaller than 1.

In the example, a timing-control port of the shift-register unit of (2n−1)-th stage GOA(2n−1) is coupled to a first clock signal line CLK1, a timing-control port of the shift-register unit of (2n)-th stage GOA(2n) is coupled to a second clock signal line CLK2. Further, a timing-control port of the GOA(2n+1) is coupled to a third clock signal line CLK3 and a timing-control port of the GOA(2n+2) is coupled to a fourth clock signal line CLK4.

Referring to FIG. 5, a switch transistor M(2n−1) of the control sub-circuit in GOA(2n−1) has its first terminal coupled to a first control signal line TP1, a switch transistor M(2n) of the control sub-circuit in GOA(2n) has its first terminal coupled to a second control signal line TP2. Also, a switch transistor M(2n+1) of the control sub-circuit in GOA(2n+1) has its first terminal coupled to a third control signal line TP3 and a switch transistor M(2n+2) of the control sub-circuit in GOA(2n+2) has its first terminal coupled to a fourth control signal line TP4.

For two adjacently cascaded shift-register units of odd-numbered stage, GOA(2n−1) and GOA(2n+1), an output port OUTPUT(2n+1) of GOA(2n+1) is connected to a reset port RESET(2n−1) of GOA(2n−1) and an input port INPUT (2n+1) of GOA(2n+1) is connected to the output port OUTPUT(2n−1) of GOA(2n−1). Similarly, for two adjacently cascaded shift-register units of even-numbered stage, GOA(2n) and GOA(2n+2), an output port OUTPUT(2n+2) of GOA(2n+2) is connected to a reset port RESET(2n) of GOA(2n) and an input port INPUT(2n+2) of GOA(2n+2) is connected to the output port OUTPUT(2n) of GOA(2n).

In the embodiment, the shift-register units of odd-numbered stage in the first series are respectively controlled by a first clock signal provided to the first clock signal line CLK1. and a third clock signal provided to the third clock signal line CLK3 to scan over all odd-numbered gate lines one after another. Also, the shift-register units of even-numbered stage in the second series are respectively controlled by a second clock signal provided to the second clock signal line CLK2 and a fourth clock signal provided to the fourth clock signal line CLK4 to scan over all even-numbered gate lines one after another. Optionally, the clock signals, CLK2 and CLK4, associated with adjacently cascaded shift-register units of even-numbered stage are delayed by ¼ period of each clock pulse relative to those clock signals, CLK1 and CLK3, associated with adjacently cascaded shift-register units of odd-numbered stage.

Each shift-register unit of either odd-numbered stage cascaded in the first series of or even-numbered stage cascaded in the second series of the gate-driving circuit contains a control sub-circuit as shown in FIG. 1 and FIG. 2. A touch-control operation can be inserted between any two operations of gate line scanning performed by two adjacently cascaded shift-register units in either first series or second series, during which the control sub-circuit thereof can be operated to ensure that the pull-up node voltage level of shift-register unit of current stage does not drop after the gate line scanning performed by the shift-register unit of previous stage. Thus, it prevents the drop of gate-driving signals outputted by the shift-register of current stage and all subsequent stages to affect gate line scanning of all stages of entire display apparatus to ensure good image quality.

Figure 6:
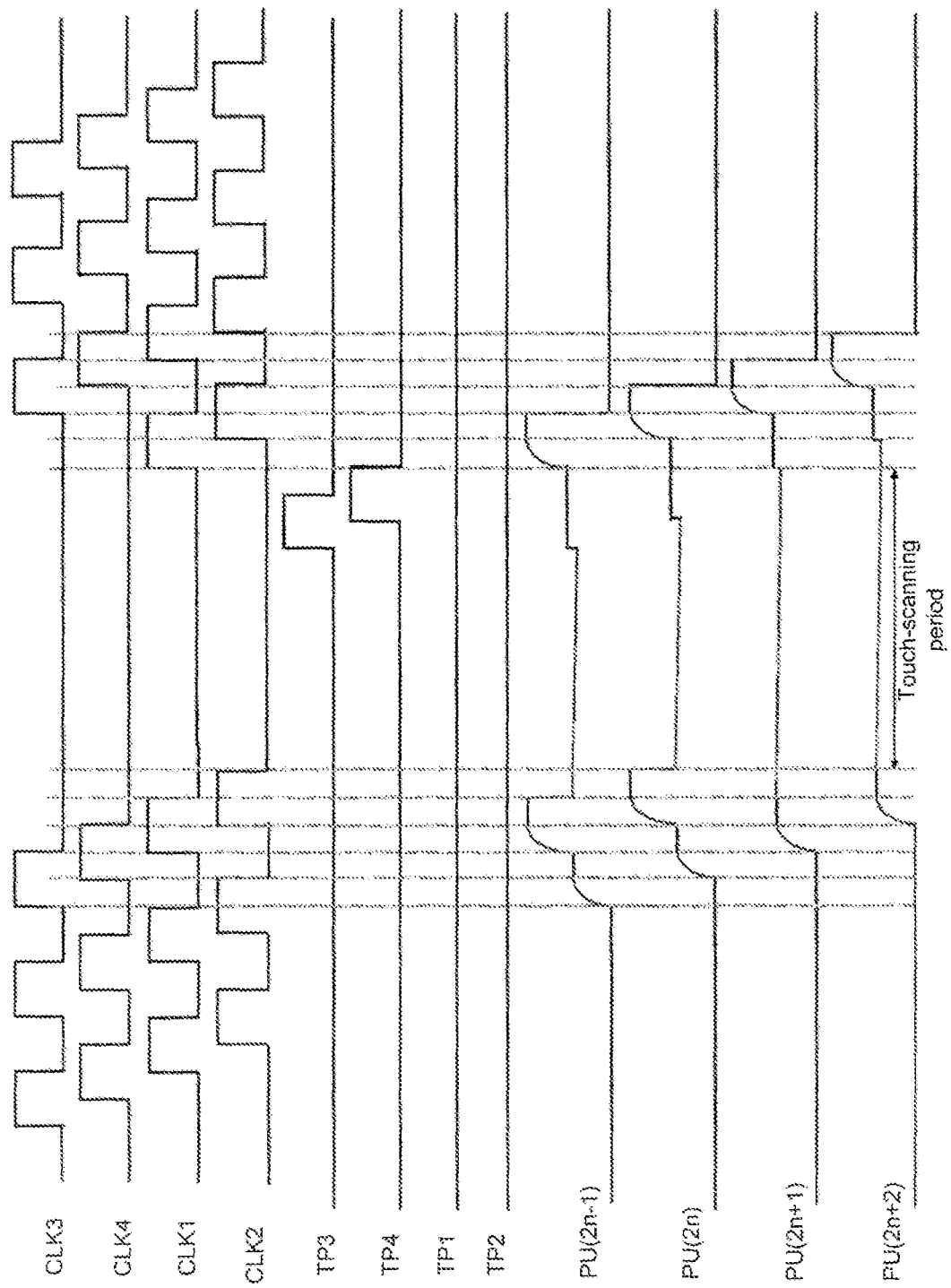
FIG. 6 is a timing waveform of operating the gate-driving circuit of FIG. 5 according to an embodiment of the present disclosure.

In addition, the present disclosure provides a method of driving the gate-driving circuit configured as shown in FIG. 5. FIG. 6 shows a tinning waveform for illustrating the method. Referring to timing waveform in FIG. 6 and circuitry in FIG. 5, in a driving cycle, the method includes sending a first clock driving signal from the first clock signal line CLK1 to the GOA(2n−1), sending a second clock driving signal from the second clock signal line CLK2 to the GOA(2n), sending a third clock driving signal from the third clock signal line CLK3 to the GOA(2n+1), and sending a fourth clock driving signal from the fourth clock signal line CLK4 to the GOA(2n+2). Before a touch-control operation ends, the method of driving the gate-driving circuit includes providing a first control signal from the first control signal line TP1 to a control sub-circuit of GOA(2n−1), providing a second control signal from the second control signal line TP2 to a control sub-circuit of GOA(2n), providing a third control signal from the third control signal line TP3 to a control sub-circuit of GOA(2n+1), and providing a fourth control signal from the fourth control signal line TP4 to a control sub-circuit of GOA(2n+2). Here, n is an integer no smaller than 1.

In an example, a touch-control operation is performed in a touch period inserted after a gate line scanning of (2n)-th stage and before another gate line scanning of (2n+1)-th stage. During the time of performing a gate line scanning by the shift-register unit of (2n)-th stage GOA(2n) and entire touch period, the shift-register unit of (2n+1)-th stage stops its gate line scanning. The GOA(2n) is cascaded to the GOA(2n+2) in the second series and the GOA(2n−1) is cascaded to the GOA(2n+1) in the first series. Optionally, the gate line scanning of (2n+1)-th stage is delayed by ¼ period of the clock signal relative to the gate line scanning of (2n)-th stage. During the touch period which can be as long as several hundreds of mini-seconds, the voltage levels at a pull-up node PL (2n+2) in the GOA(2n+2) and a pull-up node PU(2n+1) in the GOA(2n+1) are likely to drop slightly due to leakage current of internal switch transistors in GOA(2n+2) and GOA(2n+1). Therefore, the method includes providing a third control signal from TP3 to the GOA(2n+1) and simultaneously providing a fourth control signal from TP4 to the GOA(2n+2) or with a delay (after providing the third control signal) so as to avoid the drop of voltage at the pull-up node PU(2n+2) of the GOA(2n+2) to ensure stability of a gate-driving signal outputted from the GOA(2n+2) to the gate line of (2n+2)-th stage as well to avoid the drop of voltage at the pull-up node PU(2n+1) of the GOA(2n+1) to ensure stability of a gate-driving signal outputted from the GOA(2n+1) to the gate line of (2n+1)-th stage.

Optionally, the gate-driving circuit with a plurality of shift-register units cascaded in multiple series respectively associated with multiple clock signal lines CLKx and several control signal lines TPx shown in the example of FIG. 5 can be expanded to a gate-driving circuit with 6 clock signal lines, or 8 clock signal lines, or 10 clock signal lines to respectively provide 6 clock signals, 8 clock signals, or 10 clock signals, or others. The gate-driving circuit is configured to drive corresponding gate line scanning operations and allow a touch-control operation to be performed in a touch period inserted into arbitrary two adjacent gate line scanning operations and avoid drop of voltage at the pull-up node of corresponding shift-register unit (GOA) to maintain stability of the gate-driving signal outputted from the GOA to ensure good display quality of any display apparatus using the gate-driving circuit, In still another aspect, the present disclosure provides a display apparatus has both image display function and touch-control function. The display apparatus includes the gate-driving circuit described herein with cascaded shift-register units in multiple stages. Each shift-register unit in the cascaded series shown in FIG. 4 and FIG. 5 includes a control sub-circuit for controlling the operation of any two adjacently coupled shift-register units as a touch-control operation is inserted in between the corresponding two gate line scanning operations to achieve stability in gate-driving signal outputted therefrom and in turn a good image quality displayed after the touch-control operation ends.

The display apparatus can be one selected from a liquid-crystal display panel, liquid-crystal TV, digital displayer, smart phone, navigator or any product or component having an image display function plus a touch-control function.

The foregoing description of the embodiments of the invention has been presented for purposes of illustration and description. it is not intended to be exhaustive cam to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as dying the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A gate-driving circuit comprising multiple shift-register units cascaded electrically in multiple stages;
   wherein the multiple shift-register units comprises a shift-register unit;
   wherein the shift-register unit comprises:
   a main sub-circuit configured to generate an output signal for driving a gate line scanning of current stage and to charge a pull-up node of next stage to a high-voltage level; and
   a control sub-circuit coupled to the main sub-circuit and a shift-register unit of previous stage, the control sub-circuit being configured to recharge a pull-up node of previous stage during a touch-control operation performed after a gate line scanning of previous stage ends and before the gate line scanning of current stage starts;
   wherein the multiple shift-register units comprise a single series of shift-register units cascaded from a 1st-stage to an N-th stage with a respective even-numbered stage adjacently coupled to a respective odd-numbered stage,
   a respective shift-register unit of odd-numbered stage comprises a timing-control port coupled to a first clock signal line and a control sub-circuit including a switch transistor having a first terminal coupled to a first control line;
   a respective shift-register unit of even-numbered stage comprises a timing-control port coupled to a second clock signal line and a control sub-circuit including a switch transistor having a first terminal coupled to a second control line;
   wherein for any two adjacently cascaded stages in the single series, an output port of a shift-register unit of current stage is coupled to a reset port of a shift-register unit of previous stage and an input port of the shift-register unit of current stage is coupled to an output port of the shift-register unit of previous stage.

2. A gate-driving circuit comprising multiple shift-register units cascaded electrically in multiple stages;
   wherein the multiple shift-register units comprises a shift-register unit;
   wherein the shift-register unit comprises:
   a main sub-circuit configured to generate an output signal for driving a gate line scanning of current stage and to charge a pull-up node of next stage to a high-voltage level; and
   a control sub-circuit coupled to the main sub-circuit and a shift-register unit of previous stage, the control sub-circuit being configured to recharge a pull-up node of previous stage during a touch-control operation performed after a gate line scanning of previous stage ends and before the gate line scanning of current stage starts;
   wherein the multiple shift-register units comprise a first series of shift-register units of all odd-numbered stages cascaded electrically one after another and a second series of shift-register units of all even-numbered stages cascaded electrically one after another;
   wherein a respective shift-register unit of $(2n-1)$-th stage in the first series comprises a timing-control port coupled to a first clock signal line and a control sub-circuit including a switch transistor having a first terminal coupled to a first control line;
   a respective shift-register unit of $(2n)$-th stage in the second series adjacent to the respective shift-register unit of $(2n-1)$-th stage in the first series comprises a timing-control port coupled to a second clock signal line and a control sub-circuit including a switch transistor having a first terminal coupled to a second control line;
   a respective shift-register unit of $(2n+1)$-th stage in the first series adjacent to the respective shift-register unit of $(2n)$-th stage in the second series comprises a timing-control port coupled to a third clock signal line and a control sub-circuit including a switch transistor having a first terminal coupled to third control line; and
   a respective shift-register unit of $(2n+2)$-th stage in the second series adjacent to the respective shift-register unit of $(2n+1)$-th stage in the first series comprises a timing-control port coupled to a fourth clock signal line and a control sub-circuit including a switch transistor having a first terminal coupled to fourth control line;
   wherein n is an integer equal to or greater than 1.

3. A display apparatus comprising:
   a gate driving circuit comprising multiple shift-register units cascaded electrically in multiple stages; wherein the multiple shift-register units comprises a shift-register unit: wherein the shift-register unit comprises: a main sub-circuit configured to generate an output signal for driving a gate line scanning of current stage and to charge a pull-up node of next stage to a high-voltage level; and a control sub-circuit coupled to the main sub-circuit and a shift-register unit of previous stage, the control sub-circuit being configured to recharge a pull-up node of previous stage during a touch-control operation performed after a gate line scanning of previous stage ends and before the gate line scanning of current stage starts, wherein the multiple shift-register units comprise a single series of shift-register units cascaded from a 1st-stage to an N-th stage with a respective even-numbered stage adjacently coupled to a respective odd-numbered stage, a respective shift-register unit of odd-numbered stage comprises a timing-control port coupled to a first clock signal line and a control sub-circuit including a switch transistor having a first terminal coupled to a first control line;

a respective shift-register unit of even-numbered stage comprises a timing-control port coupled to a second clock signal line and a control sub-circuit including a switch transistor having a first terminal coupled to a second control line;

wherein for any two adjacently cascaded stages in the single series, an output port of a shift-register unit of current stage is coupled to a reset port of a shift-register unit of previous stage and an input port of the shift-register unit of current stage is coupled to an output port of the shift-register unit of previous stage.

4. A method of driving a gate-driving circuit comprising multiple shift-register units cascaded electrically in multiple stages;

wherein the multiple shift-register units comprises a shift-register unit;

wherein the shift-register unit comprises:

a main sub-circuit configured to generate an output signal for driving a gate line scanning of current stage and to charge a pull-up node of next stage to a high-voltage level; and a control sub-circuit coupled to the main sub-circuit and a shift-register unit of previous stage, the control sub-circuit being configured to recharge a pull-up node of previous stage during a touch-control operation performed after a gate line scanning of previous stage ends and before the gate line scanning of current stage starts;

the method comprising:

performing a gate line scanning of previous stage before entering a touch period;

performing a touch-control operation during the touch period;

performing an internal voltage compensation to the shift-register unit of previous stage before the touch period ends;

repeating the gate line scanning of previous stage based on the internal voltage compensation after the touch period ends; and performing a gate line scanning of current stage;

wherein performing the gate line scanning of previous stage comprises:

providing a first clock signal at a turn-on level to the main sub-circuit in the shift-register unit of previous stage in a first charging period and a second clock signal at a turn-off level to the main sub-circuit in a shift-register unit of current stage in a repeat-driving period, thereby outputting a gate-driving signal at the turn-on level to a gate line of previous stage; and using the gate-driving signal outputted from the shift-register unit of previous stage to charge a pull-up node in the shift-register unit of current stage up to the turn-on level in the first charging period.

5. The method of claim 4, wherein the performing the touch-control operation comprises providing no clock signal to the shift-register unit of previous stage and the shift-register unit of current stage to substantially maintain the turn-on level at the pull-up node in the shift-register unit of current stage and a pull-up node in the shift-register unit of previous stage in the touch period after the first charging period.

6. The method of claim 5, wherein the performing an internal voltage compensation comprises providing a control voltage to a control signal line of the control sub-circuit in the shift-register unit of current stage in a second charging period before the touch period ends to charge the pull-up node of the shift-register unit of previous stage back to the turn-on level.

7. The method of claim 6, wherein the repeating the gate line scanning of previous stage comprises providing the first clock signal at a turn-on level to the shift-register unit of previous stage in a repeat-driving period after the touch period ends and the second clock signal at a turn-off level to the shift-register unit of current stage in the repeat-driving period, thereby outputting a gate-driving signal at the turn-on level to the gate line of previous stage and perform an internal voltage compensation to the shift-register unit of current stage.

8. The method of claim 7, wherein the performing a gate line scanning of current stage comprises providing the second clock signal at the turn-on level to the main sub-circuit in the shift-register unit of current stage and the first clock signal at a turn-off level to the shift-register unit of previous stage, thereby outputting a gate-driving signal at the turn-on level to a gate line of current stage in a continue-scanning period after the repeat-driving period.

9. The method of claim 4, further comprising performing a touch-control operation after performing a gate line scanning of previous stage adjacently cascaded to current stage.

10. The method of claim 9, wherein the multiple shift-register units comprise a single series of shift-register units cascaded from a 1st-stage to an N-th stage, wherein the performing a gate line scanning comprises, providing a first clock signal to a timing-control port of a shift-register unit of odd-numbered stage and a second clock signal to the timing-control port of a shift-register unit of even-numbered stage; and wherein the performing the touch-control operation comprises:

suspending the first clock signal and the second clock signal in a touch period; and providing a first control signal to the control sub-circuit of the shift-register unit of odd-numbered stage and a second control signal to the control sub-circuit of the shift-register unit of even-numbered stage at an end of the touch period.

11. The method of claim 9, wherein the multiple shift-register units comprise a first series of shift-register units of all odd-numbered stages cascaded electrically one after another and a second series of shift-register units of all even-numbered stages cascaded electrically one after another;

wherein the performing a gate line scanning comprises, providing a first clock signal to a timing-control port of a shift-register unit of (2n−1)-th stage in the first series, a second clock signal to the timing-control port of a shift-register unit of (2n)-th stage in the second series, a third clock signal to the timing-control port of a shift-register unit of (2n+1)-th stage in the first series, and a fourth clock signal to the timing-control port of the shift-register unit of (2n+2)-th stage in the second series; wherein the third clock signal, the fourth clock signal, the first clock signal, and the second clock signal are characterized by a pulse period and loaded with a same turn-on level sequentially in time with a relatively delayed by ¼ of the pulse period; and wherein the performing the touch-control operation comprises, suspending the first clock signal, the second clock signal, the third clock signal, and the fourth clock signal in a touch period;

providing a first control signal to the control sub-circuit of the shift-register unit of (2n−1)-th stage in the first series, a second control signal to the control sub-circuit of the shift-register unit of (2n)-th stage in the second series, a third control signal to the control sub-circuit of the shift-register unit of (2n+1)-th stage in the first series, and a fourth control signal to the control sub-circuit of the shift-register unit of (2n+2)-th stage in the second series at an end of the touch period;

wherein the third control signal and the fourth control signal are characterized by the pulse period and loaded with a same turn-on level sequentially in time with a delay of ¼ of the pulse period, the first control signal and the second control signal are characterized by a same turn-off level;

wherein n is an integer no smaller than 1.

12. The method of claim 11, further comprising, before stopping the touch period after performing the gate line scanning of the (2n)-th stage, providing a third control signal to the control sub-circuit of the shift-register unit of (2n+1)-th stage in the first series and subsequently or at the same time providing a fourth control signal to the control sub-circuit of the shift-register unit of (2n+2)-th stage in the second series.

13. The gate-driving circuit of claim 1, wherein the main sub-circuit comprises a pull-up node, the control sub-circuit comprises a switch transistor and a control line configured to be provided with a control signal, the switch transistor having a gate coupled to the pull-up node, a first terminal coupled to the control line, and a second terminal coupled to an input port of the shift-register unit of previous stage.

14. The gate-driving circuit of claim 13, wherein the switch transistor comprises an NPN-type transistor.

15. The gate-driving circuit of claim 13, wherein the switch transistor comprises an PNP-type transistor.

16. The gate-driving circuit of claim 1, wherein the main sub-circuit comprises an output port coupled to a reset port of the shift-register unit of previous stage and an input port coupled to an output port of the shift-register unit of previous stage.

* * * * *